United States Patent
Veneroso et al.

(10) Patent No.: US 12,406,707 B2
(45) Date of Patent: Sep. 2, 2025

(54) METHOD OF MANAGING MEMORY IN AN INTEGRATED CIRCUIT CARD AND CORRESPONDING INTEGRATED CIRCUIT CARD

(71) Applicant: STMicroelectronics S.r.l., Agrate Brianza (IT)

(72) Inventors: Amedeo Veneroso, Caserta (IT); Carlo Cimino, Naples (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 174 days.

(21) Appl. No.: 18/295,558

(22) Filed: Apr. 4, 2023

(65) Prior Publication Data

US 2023/0335169 A1  Oct. 19, 2023

(30) Foreign Application Priority Data

Apr. 15, 2022 (IT) .................. 102022000007676

(51) Int. Cl.
| | |
|---|---|
| G11C 16/06 | (2006.01) |
| G11C 8/04 | (2006.01) |
| G11C 8/16 | (2006.01) |

(52) U.S. Cl.
CPC . *G11C 8/04* (2013.01); *G11C 8/16* (2013.01)

(58) Field of Classification Search
CPC ....................................................... G11C 16/06
See application file for complete search history.

(56) References Cited

U.S. PATENT DOCUMENTS

| | | |
|---|---|---|
| 7,039,774 B1 | 5/2006 | Cruz-Rios et al. |
| 2007/0011660 A1 | 1/2007 | Garyali et al. |
| 2022/0044099 A1* | 2/2022 | Conte .................. G06N 3/045 |

OTHER PUBLICATIONS

Jin, Min-Sik et al., "A Study on Fast JCVM with New Transaction Mechanism and Caching-Buffer Based on Java Card Objects with a High Locality", Korea, IFIP International Federation for Information Processing, Dec. 2005, 10 pages.

Marquet, Kevin et al., "An object memory management solution for small devices with heterogeneous memories", France, Fifth Workshop on Intelligent Solutions in Embedded Systems, Jun. 21-22, 2007, 11 pages.

(Continued)

*Primary Examiner* — Jason Lappas
(74) *Attorney, Agent, or Firm* — Slater Matsil, LLP

(57) ABSTRACT

A method of managing memory in an integrated circuit card comprising a non-volatile memory portion and a RAM memory portion, the method comprising creating in a non-volatile memory heap one or more array pointers, corresponding to one or more transient arrays to be allocated, each array pointer comprising a transient array size and a transient array address, wherein the creating comprises creating one or more array pointers comprising as transient array address a logical address of the area of the RAM memory portion in which the respective transient array is to be allocated, and assigning then in the RAM memory area memory only to transient arrays, corresponding to the respective one or more array pointers, which comprise at least a value different from zero.

20 Claims, 10 Drawing Sheets

(56) References Cited

OTHER PUBLICATIONS

"Java Card: Programming Guidelines and Best Practise Introduction", RuimTools: JavaCard best programming guidelines, https://web.archive.org/web/20220402084336/http://ruimtools.com/doc.php?doc=jc_best, Nov. 15, 2022, 7 pages.

Yang, Yoon-Sim et al., "An Advanced Java Card System Architecture for Smart Card Based on Large RAM Memory", South Korea, Computer Society, 2006 International Conference on Hybrid Information Technology (ICHIT'O6), Nov. 9-11, 2006, 5 pages.

"JCSystem (Java Card API, Classic Edition)," The Wayback Machine, https://docs.oracle.com/javacard/3.0.5/api/javacard/framework/JCSystem.html, Nov. 2017, 14 pages.

* cited by examiner

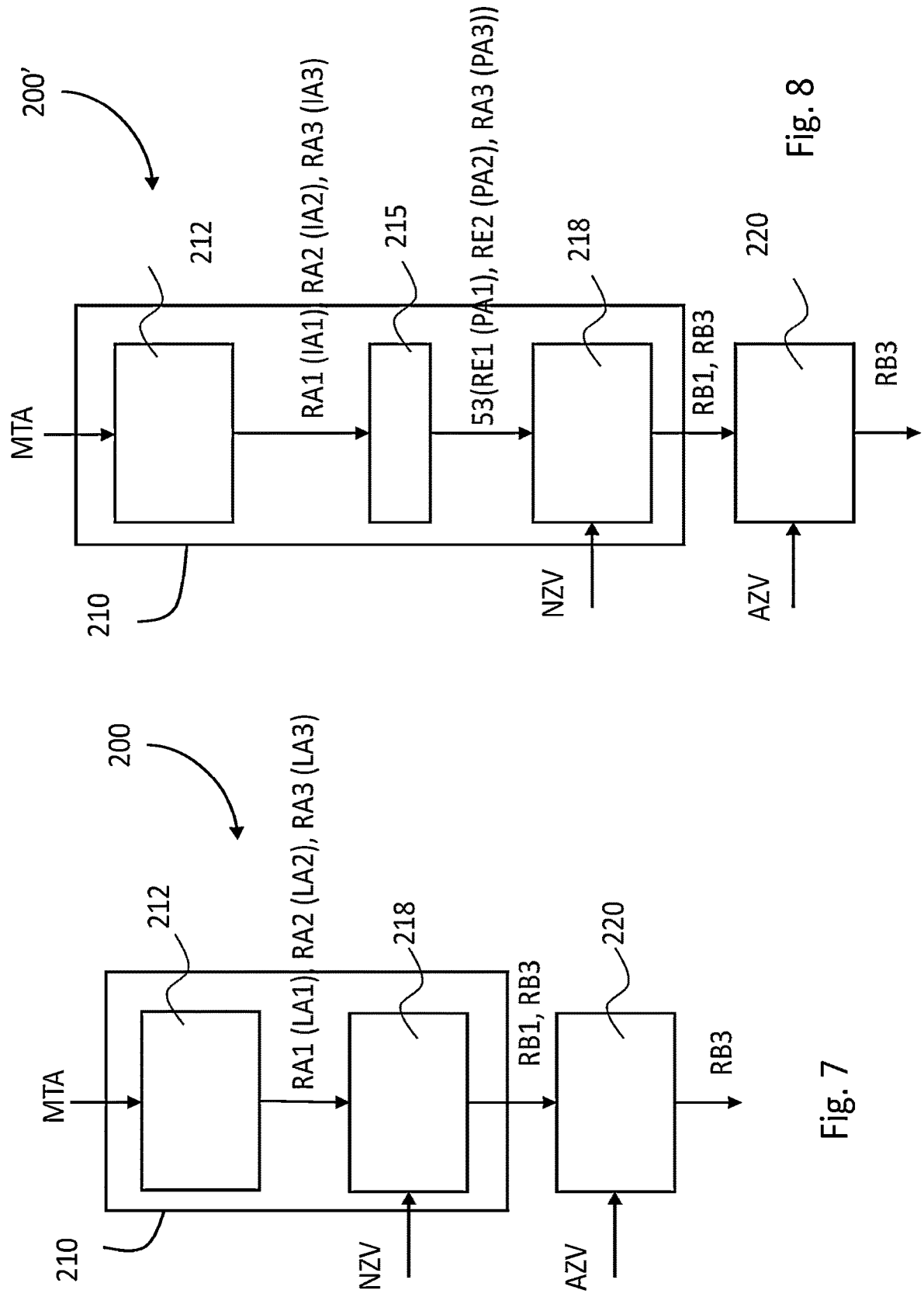

METHOD OF MANAGING MEMORY IN AN INTEGRATED CIRCUIT CARD AND CORRESPONDING INTEGRATED CIRCUIT CARD

CROSS-REFERENCE TO RELATED APPLICATIONS

This application claims the benefit of Italian Patent Application No. 102022000007676, filed on Apr. 15, 2022, which application is hereby incorporated herein by reference.

TECHNICAL FIELD

Embodiments of the present disclosure relate to techniques of managing memory in an integrated circuit card using a Java Card platform.

Embodiments of the present disclosure relate in particular to multi-applicative and/or multi-profile cards, such as secure elements, telecom cards, banking cards.

BACKGROUND

Universal Integrated Circuit Cards (UICCs), often referred as Subscriber Identity Module (SIM) cards, are widely used to enable the mobile devices to access services provided by Mobile Network Operators (MNOs).

In this context, FIG. 1 shows a possible architecture of a "user equipment" 10, such as a mobile device, e.g., a smartphone or a tablet, or a mobile communication module usually to be used in embedded systems.

Generally, the device 10 comprises one or more processors 102 connected to one or more memories 104. The device 10 comprises moreover at least one mobile communication interface 106 for communication with a base station BS.

For example, the mobile communication interface 106 may comprise a GSM (Global System for Mobile Communications), CDMA (Code Division Multiple Access) transceiver, W-CDMA (Wideband Code Division Multiple Access), UMTS (Universal Mobile Telecommunications System), HSPA (High-Speed Packet Access) and/or LTE (Long Term Evolution) transceiver.

A mobile device also often comprises a user interface 110, such as a touchscreen. Conversely, a communication module to be used, e.g., in embedded systems, such as alarm systems, gas meters or other types of remote monitoring and/or control systems, often does not comprise a user interface 110, but a communication interface 112 in order to exchange data with a further processing unit of an embedded system. For example, in this case, the interface 112 may be a digital communication interface, such as a UART (Universal Asynchronous Receiver-Transmitter), SPI (Serial Peripheral Interface) and/or USB (Universal Serial Bus) communication interface. Generally, the processing unit 102 may also be directly the main processor of an embedded system. In this case the interface 112 may be used to exchange data with one or more sensors and/or actuators. For example, in this case, the interface 112 may be implemented by means of one or more analog interfaces and/or digital input/output ports of the processing unit 102.

In the memory 104 may be stored e.g., an operating system OS being executed by the processor 102 and which manages the general functions of the device 10, such as the management of the user interface no and/or the communication interface 112 and the establishment of a connection to the base station BS via the interface 106. The memory 104 may also contain applications being executed by the operating system OS. For example, in the case of a mobile device, the memory 104 often comprises a web browser application WB.

For establishing a connection with the base station BS, the device 10 is coupled to a processing unit 108 configured to manage the identity identification of the user. For example, usually a mobile device comprises a card holder for receiving a card comprising a Subscriber Identity Module (SIM), which is usually called SIM card. Generally, a corresponding SIM module may also be installed directly within the device 10. In the example of FIG. 1 it is used a Universal Integrated Circuit Card (UICC) 108, which is a smart card often used in GSM and UMTS networks. The UICC ensures the integrity and security of all kinds of personal data and typically holds a few hundred kilobytes. Also, a UICC may be integrated directly in the device 10 and is in this case often called embedded UICC (eUICC).

For example, in a GSM network, the UICC 108 contains a SIM application and in a UMTS network a USIM application. A UICC may contain several applications, making it possible for the same smart card to give access to both GSM and UMTS networks, and may also provide storage of a phone book and other applications.

Accordingly, the reference to a SIM module in the following of the present description is intended to include modules for the above network and applies also the case in which such a SIM module is provided on a SIM card.

As shown in FIG. 2, a SIM module 108 often comprises one and more processors 1082 and one or more memories 1084 for executing applications stored in the memory 1084 of the module 108. For example, the SIM module 108 may comprise in addition to the Subscriber Identity Module application (reference sign SIM in FIG. 2) at least one further application APP. For example, this application APP may be configured to communicate (directly, or indirectly via the processor 102 and possibly the operating system OS) with the mobile communication interface 106 in order to send data to and/or receive data from a remote host 30. For this purpose, the host 30 may be connected via a network 20, such as a Local Area Network (LAN) or a Wide Area Network (WAN), such as the internet, to the base station BS. Accordingly, connection between the host 30 and the UICC 108 may be established by means of the network 20, the base station BS and the communication interface 108. Generally, the communication may be initiated by the host 30 or the UICC 108. For example, the application APP may be a web server application, which receives requests from the web browser WB of a mobile device 10 and obtains respective content from a remote host 30, such as a web server. The application APP may also be an authentication application. In this case, the host 30 may send an authentication request to the UICC 108 and the UICC 108 may send an authentication response to the host 30. The memory or a plurality of memories 1084 can be used also to store data images comprising the profile or the profiles pertaining different MNOs and operating systems related to the image. For image is here intended a structured representation of binary information, which is also encrypted, which is also configured to decrypt encapsulated data, manage rights and check the integrity of loaded decrypted data.

Thus, a UICC card in short usually comprises a microprocessor and a memory, typically including a non-volatile and a volatile portion. Such memory is configured to store data such as an operating system, applets and an MNO profile that a mobile device can utilize to register and interact with an MNO. The UICC can be removably introduced in a slot of a device, i.e., a mobile device, or they can also be embedded directly into the devices, in this case they are called eUICC.

Under this view, volatile memory, specifically RAM (Random Access Memory), is today the rarest resource on the integrated circuit card, in particular UICC (Universal Integrated Circuit Card) or embedded UICC. Typically, the RAM resource is the first that is depleted. This implies that an efficient management of the volatile memory is necessary.

Applications in integrated circuit cards are typically Java Card applications, i.e., the Java platform for integrated cards.

The Java Card platform presents some drawback regarding the RAM resources. One is that RAM is typically allocated at application installation. RAM can be of two types, clear on reset and clear on deselect, where Clear On Deselect (CoD) is not practical in Telecom toolkit application, while Clear On Reset (CoR) is virtually always available.

RAM allocation and deallocation in Java Card is slow.

Arrays in Java Card are by default stored in flash (e.g., storing an array a as a=new byte[20]) unless specific APIs are used (e.g., by the Java Card method JCSystem.makeTransientByteArray) which allows to allocate transient byte arrays in the RAM. Transient array data is lost (more precisely in an undefined state, but the real data is unavailable) immediately upon power loss, and is reset to the default value at the occurrence of certain events such as card reset or deselect. Updates to the values of transient arrays are not atomic and are not affected by transactions. Such transient arrays are not fully transient, this meaning that the object header is stored in a non-volatile memory of the card, specifically a flash memory. Thus, the flash header in the non-volatile memory points to the object RAM body, i.e., transient byte array, in the RAM.

The arrays—like all Java Card objects—are always present and they are de-allocated when no other object or variable references to it, e.g., are "unreachable" objects. As mentioned above this means that are in an undefined state, the data being unavailable.

To understand if an object is "unreachable" it is thus needed to scan the other objects to verify if someone refers it.

The operation of cancellation, in addition, may be quite slow because it requires the update in the non-volatile memory, i.e., flash, memory of the header and also of other headers if defragging is needed. Because of this slow dynamic, arrays are allocated at installation time and never deallocated.

These operations are exemplified in FIG. 3, where it is shown schematically a Java object heap 51, which is stored in a non-volatile memory portion of the memory 1084 of the card 108 implementing Java Card, this last not shown. The heap space of the Java object heap 51 is used for the dynamic memory allocation of Java objects and JRE classes at runtime. New objects are always created in heap space, and the references to these objects are stored in stack memory. This memory, in contrast to stack, is not automatically deallocated. It needs a Garbage Collector to free up unused objects so as to keep the efficiency of the memory usage. Garbage Collector attempts to reclaim memory which was allocated by the program, but is no longer referenced The Java object heap 51 comprises objects O some of which are RAM array pointers RA, and NVM arrays NA. Specifically, indicated are a first RAM array pointer RA1, a second RAM array pointer RA2 and a third RAM array pointer RA3.

With 52 is indicated a Java transient body heap stored in the RAM memory portion of the memory 1084 of the card 108 using Java Card, which stores three array bodies, RB1 (e.g., size 200 bytes), RB2 (e.g., size 40 bytes) and RB3 (e.g., size 5000 bytes). The RAM array pointers RA1, RA2, RA3 point (as indicated by the arrows) to the respective array bodies RB1, RB2, RB3, in particular to their physical address in the RAM Java transient body heap 52.

FIG. 4 depicts schematically the situation in which an array body, specifically the second array body RB2 in the example, is removed from the Java transient body heap 52 storage. After the Garbage Collector is operated, the corresponding RAM array pointer RA2 is deleted.

Thus, in known solutions, the array pointer, or header, RA in the Java object heap 51 in the non-volatile portion of memory 1084 contains at least the following information:

an indication of the corresponding array body RB size, BS (BS1, BS2, BS3 for the three pointer RA1, RA2, RA3 in the example), which is the size of the area of RAM memory assigned to the array body RB to contain the values of the array, and a body RB physical address PA (PA1, PA2, PA3 for the three pointer RA1, RA2, RA3 in the example), which is the address of the memory areas assigned in the Java transient body heap 52 to the array body RB to contain the values of the array body RB. When the applet or application calls the Java Card method JCSystem.makeTransient . . . Array, the operative system assigns an area of the Java transient body heap 52 in the RAM portion of memory 1084 and saves its address in the array pointer RA of the array body RB. That area of the memory remains assigned to that array body RB until it is deleted (freeing the memory which was reserved to it both in the object heap 51 in the non-volatile memory 104 and the Java transient body heap 52 in the RAM.

Thus, a first solution is represented by managing at application level by means of creating the arrays when necessary and delete them when no more necessary, relying on the Java Card garbage collector.

As indicated, this solution is slow.

A different solution may involve managing at application level by means of reusing of resources. This is quite complex and error prone and the same memory cannot be shared with applets of other packages due to the Java Card firewall.

Also, it is possible to manage at application level by means of using proprietary APIs to allocate/deallocate memory. This also may be slower and in addition applets need to be customized for the platform supporting them.

SUMMARY

On the basis of the foregoing description, the need is felt for solutions which overcome one or more of the previously outlined drawbacks.

According to one or more embodiments, such an object is achieved through a method having the features specifically set forth in the claims that follow. Embodiments moreover concerns a related integrated circuit card.

The claims are an integral part of the technical teaching of the disclosure provided herein.

As mentioned in the foregoing, the present disclosure provides solutions regarding a method of managing memory in an integrated circuit card using a Java Card platform, the integrated circuit card comprising a non-volatile memory portion and a RAM memory portion, the method comprising a procedure for the allocation of one or more transient arrays in the RAM memory portion, the procedure comprising:

creating in a non-volatile memory heap one or more array pointers, corresponding to one or more transient arrays to be allocated, each array pointer comprising a transient array size and a transient array address, wherein the creating operation comprises creating one or more array pointers comprising as transient array address an address pointing indirectly to an area of the RAM memory portion in which the respective transient array is to be allocated, in particular a logical or indirect address, and assigning then in the RAM memory area memory only to transient arrays, corresponding to the respective one or more array pointers, which comprise at least a value different from zero.

In variant embodiments, the creating one or more array pointers comprises creating the one or more array pointers with a required body size and writing a null value as transient array address, which is a body logical address, the assigning then in the RAM memory area memory only to transient arrays, corresponding to the respective one or more array pointers, which comprise at least a value different from zero comprising, when writing a value different from zero in any point of an array body, assigning an area of the RAM memory, with the size indicated in the body size, to the corresponding transient array and saving its address in the logical address of the corresponding array pointe.

In variant embodiments, the method comprises providing an indirection table, stored in the RAM memory, comprising reference addresses pointing to physical locations of respective arrays in the RAM memory and to which the RAM array pointers in the non-volatile memory, comprising a transient array address ordinately point.

In variant embodiments, the array pointer comprises as transient array address a logical address which comprises a null value or an address of the memory area containing the indirection table in the RAM memory, comprising a corresponding reference address which in its turn contains the physical address of the RAM memory assigned to the array.

In variant embodiments, the method comprises deallocating in the RAM memory transient arrays which values are all equal to zero.

In variant embodiments, the method comprises storing in the logical address either an address of the memory area assigned to the to the array body or a null value.

In variant embodiments, the deallocating comprises, when the transient array in the RAM memory is filled with zeroes writing in the logical address of the corresponding array pointer a zero value.

In variant embodiments, the procedure for the allocation of one or more transient arrays in the RAM memory portion comprising performing a Java Card method making transient arrays.

In variant embodiments, the method comprises applying a checking rule, checking if a memory values representing the sum of the size of all the created arrays is greater than a memory value representing the total physical memory in the RAM memory increased by a safety amount which is function of a settable parameter value, in particular multiplied or summed by such settable parameter value, and in the affirmative signaling an out of memory event.

In variant embodiments, the method comprises performing the checking upon an application selection and, if an out of memory event occurs, requesting the failure of the selection.

The present disclosure also provides solutions regarding an integrated circuit card, in particular an eUICC, configured to perform the operations of the method managing memory in an integrated circuit card according to embodiments.

BRIEF DESCRIPTION OF THE DRAWINGS

Embodiments of the present disclosure will now be described with reference to the annexed drawings, which are provided purely by way of non-limiting example and in which:

FIG. 7 is a flow diagram of the method according to embodiments; and

FIG. 8 is a flow diagram of the variant of the method according to embodiments.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figures parts, elements or components which have already been described with reference to previous figures are denoted by the same references previously used in such Figures; the description of such previously described elements will not be repeated in the following in order not to overburden the present detailed description.

The solution here described is based on the observation that arrays are allocated at installation, although some of them may not be used during the card session. More specifically, the arrays are initialized at an initialization value of zero or "0" bytes, when the card is reset, i.e., a CLEAR_ON_RESET is performed, and for some arrays such initialization value may remain "0" until the next card session, i.e., the RAM memory space remain unused.

The solution here described provides actually storing in the RAM, i.e., assigning RAM memory area to the array, only the arrays that have a body value different from all "o".

Figure 1:
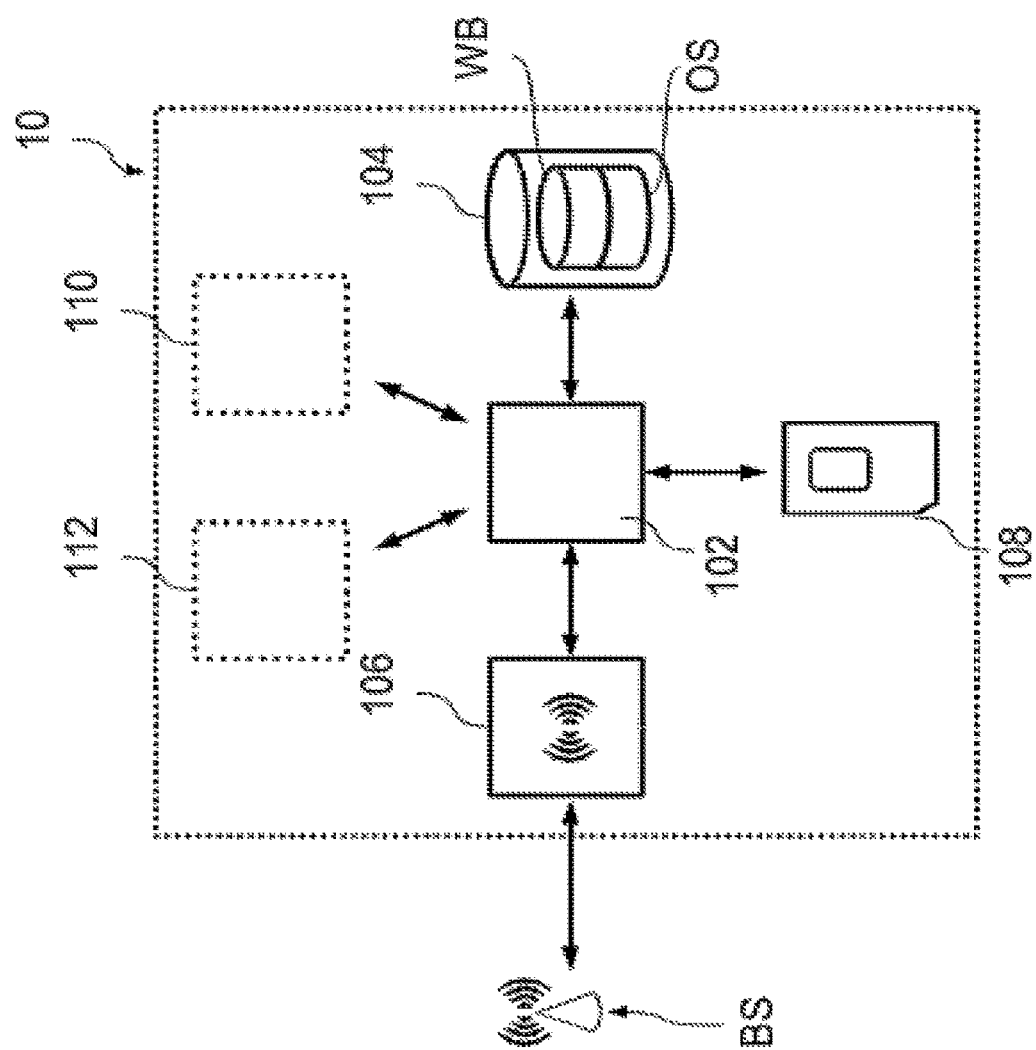
FIG. 1 shows a user equipment communicating with a base station.
Figure 2:
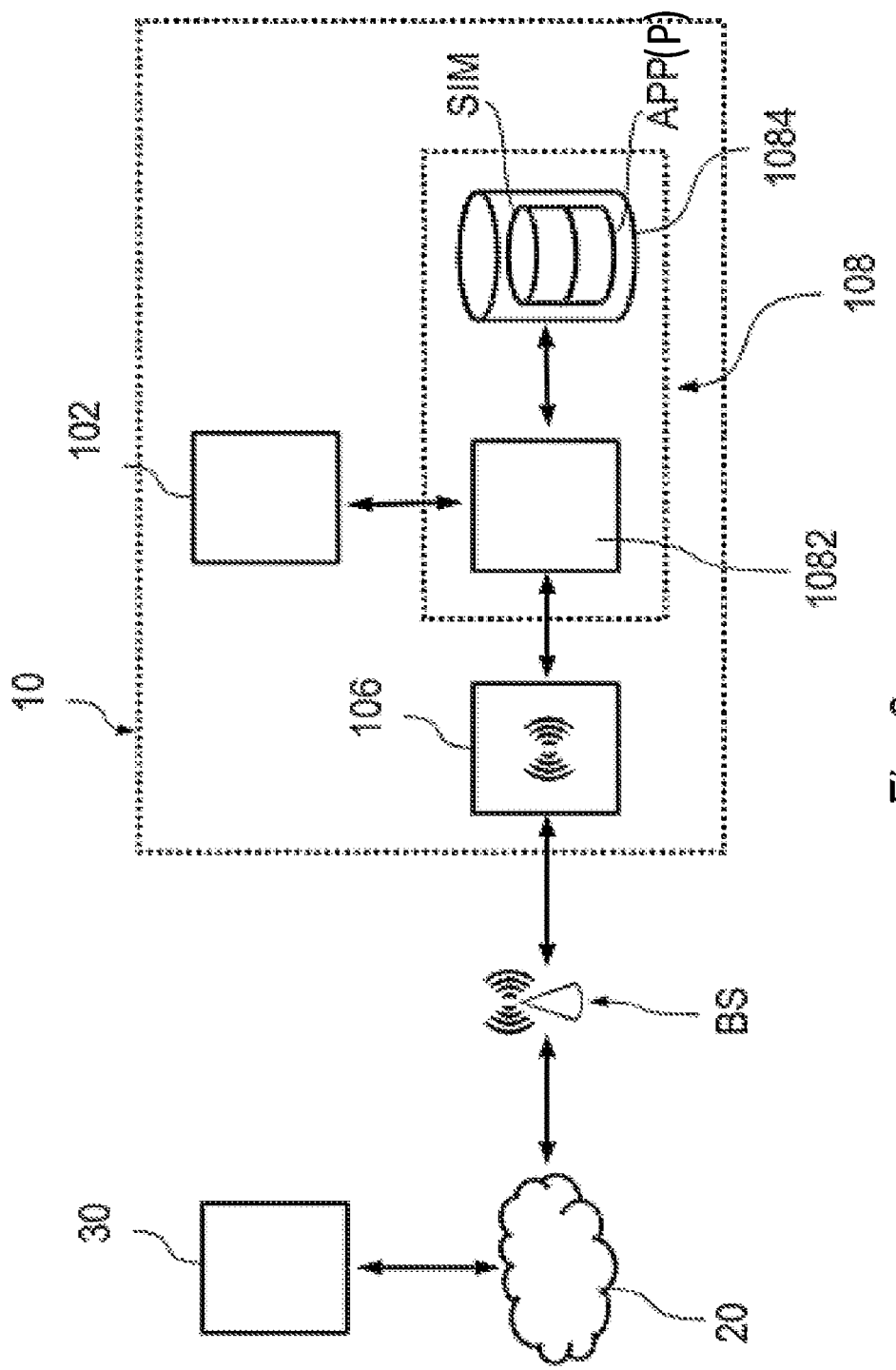
FIG. 2 shows a user equipment communicating with remote host.
Figure 3:
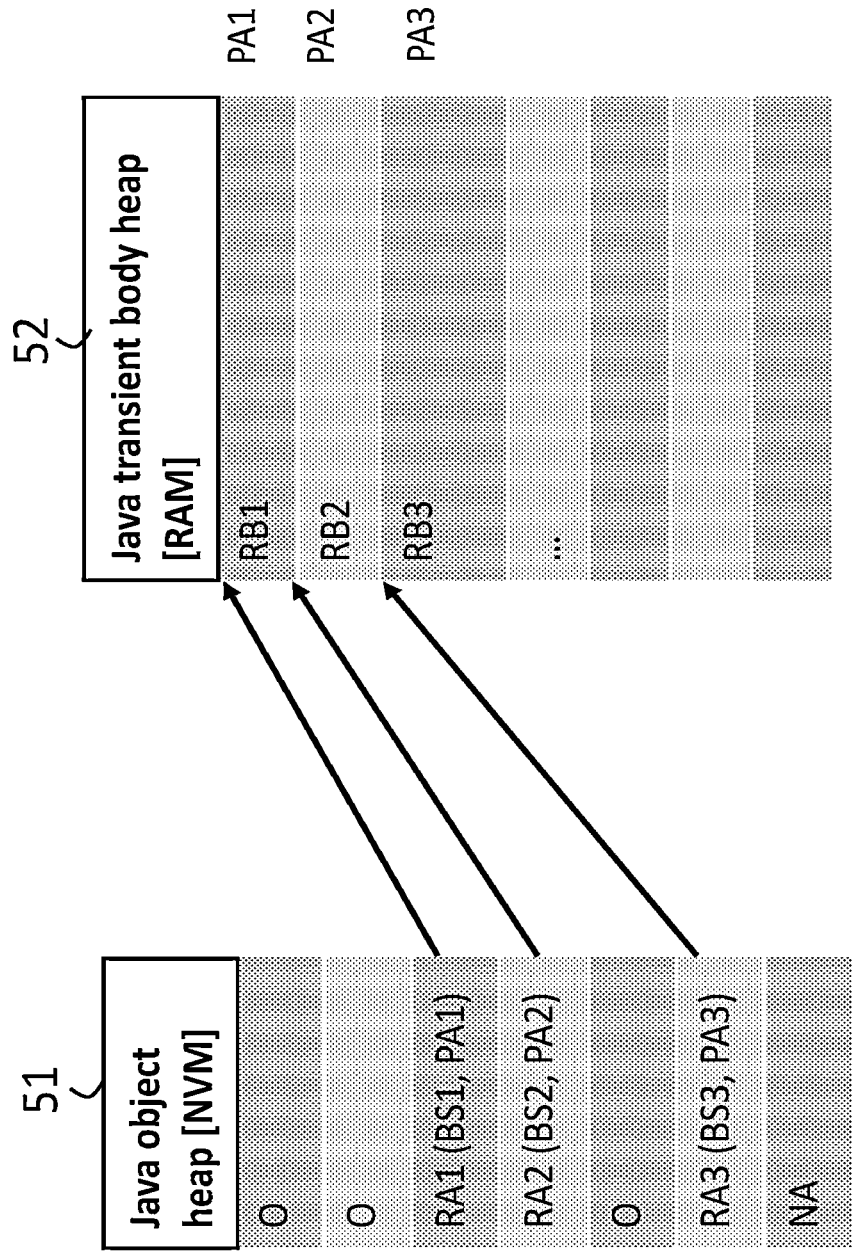
FIG. 3 shows schematically a Java object heap and a Java transient body heap.
Figure 4:
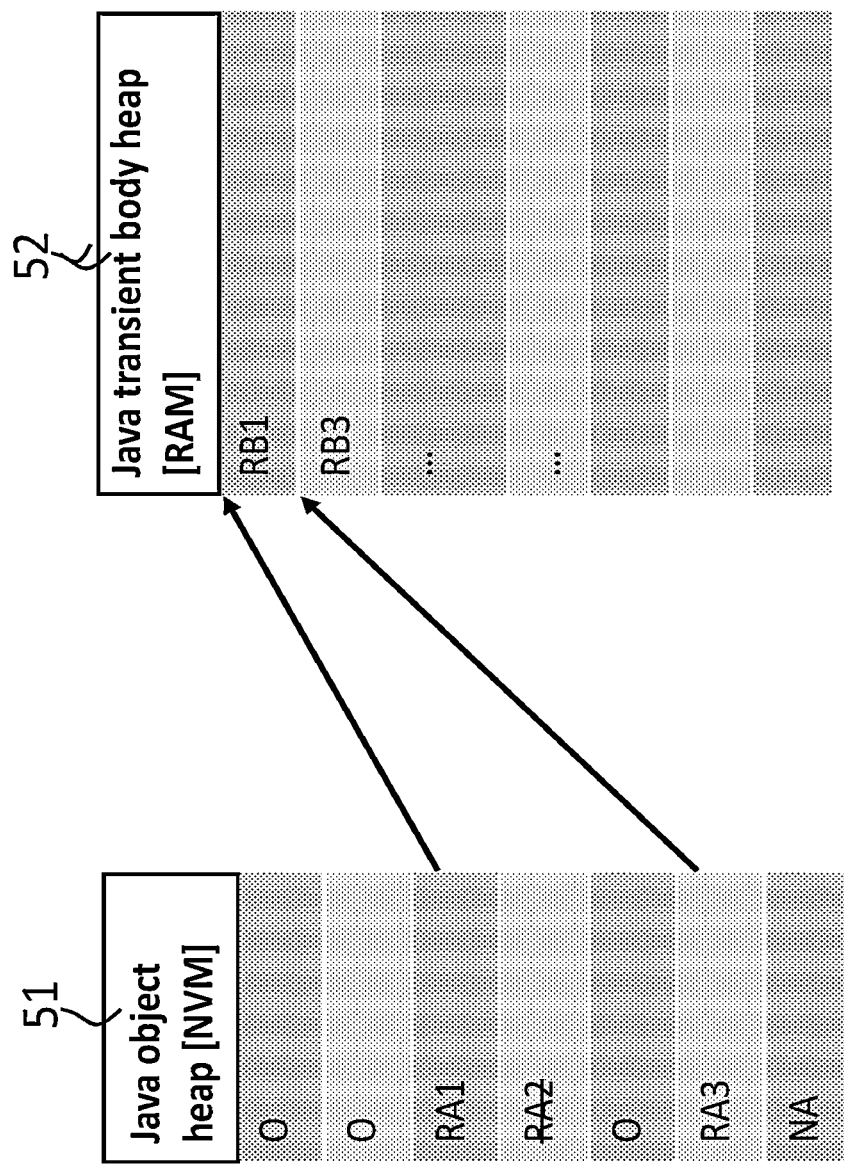
FIG. 4 shows the Java object heap and Java transient body heap after removal of an array body.
Figure 5A:
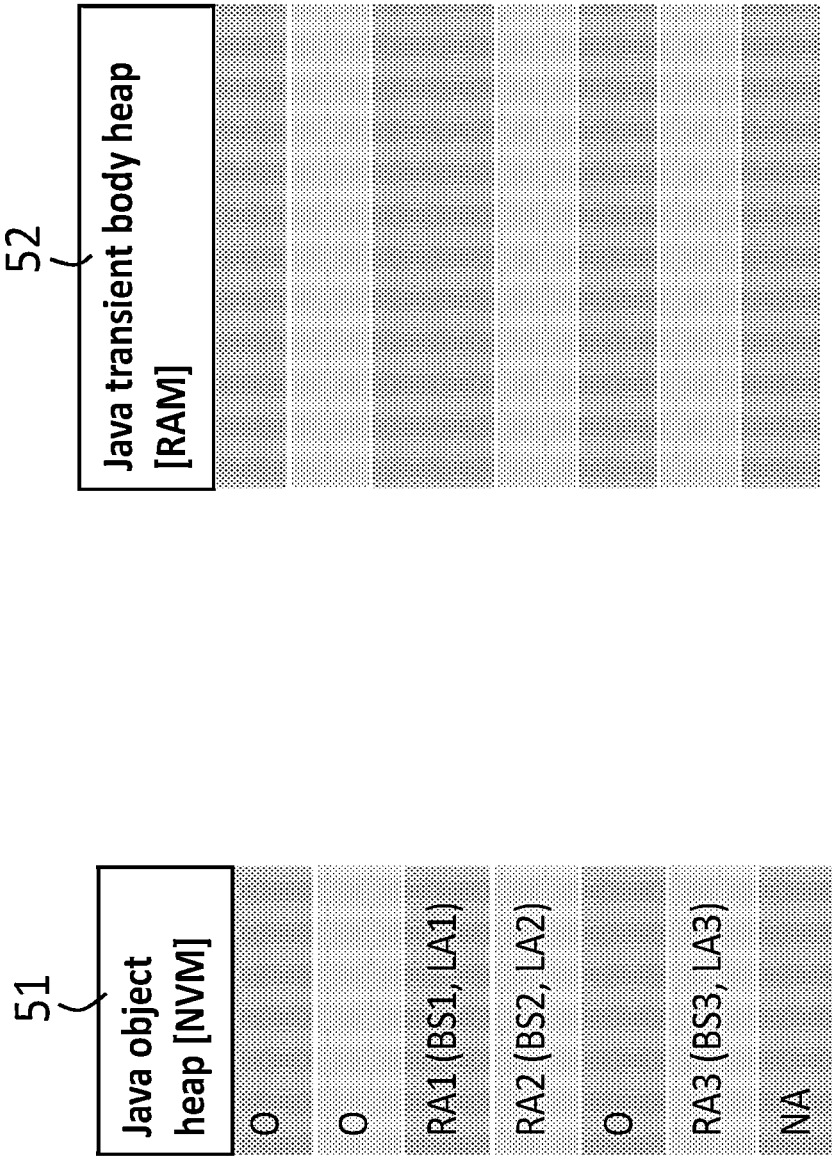
FIGS. 5A-5D show schematically operations of the method according to embodiments.

To this regard, FIG. 5A depicts a first phase according to an embodiment of the method here described in which the Java transient body heap 52 initially contains no array body RB, even if they are created (e.g., a JCSystem.MakeTransient . . . Array method has been invoked), while the Java object heap 51 comprises RAM array pointers RA1, RA2, RA3. Such array pointers RA1, RA2, RA3 are in this first phase only headers to which it does not correspond an array body in the heap 52. They are created by a Java Card method for making transient array, e.g., the MakeTransient . . . Array. The dots ' . . . ' indicate the type of Array (Boolean, Bytes, Short, Object), which creates array pointers RA1, RA2, RA3 which point to a logic address, instead of a physical address, and define a size of the transient array RB1, RB2, RB3. Thus, in the first phase the transient arrays are virtually defined, but they are not physically stored in the RAM 52.

Figure 5B:
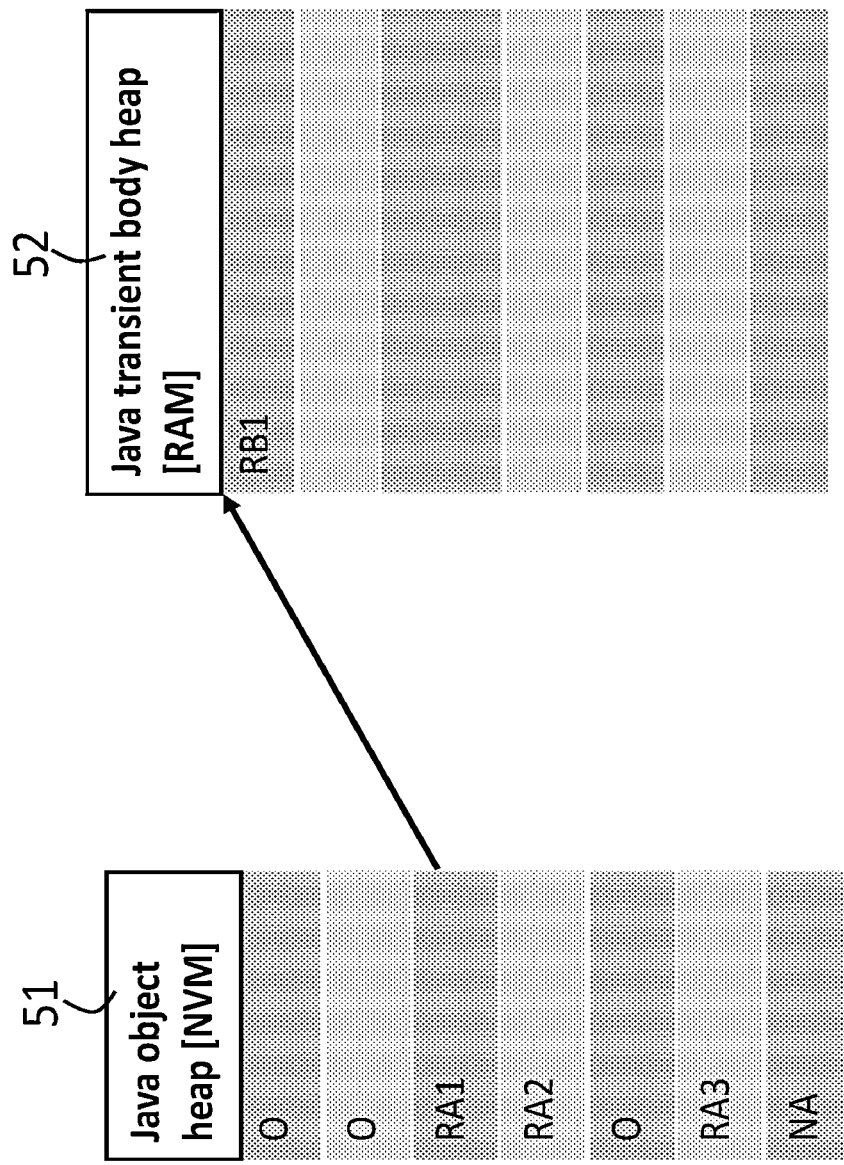

FIG. 5B depicts a second phase in which, at a first writing, for instance by an application, of a value different from zero in a first array, e.g., a first array body RB1, such first array body RB1 is allocated in the RAM, namely in the Java transient body heap 52, the allocation being performed by transforming the logical address in a RAM array pointer RA1 in a physical address which points to an area memory in the heap 52 which is assigned to the first array body RB1, i.e., a transient array RB1 is stored in the RAM.

Figure 5C:
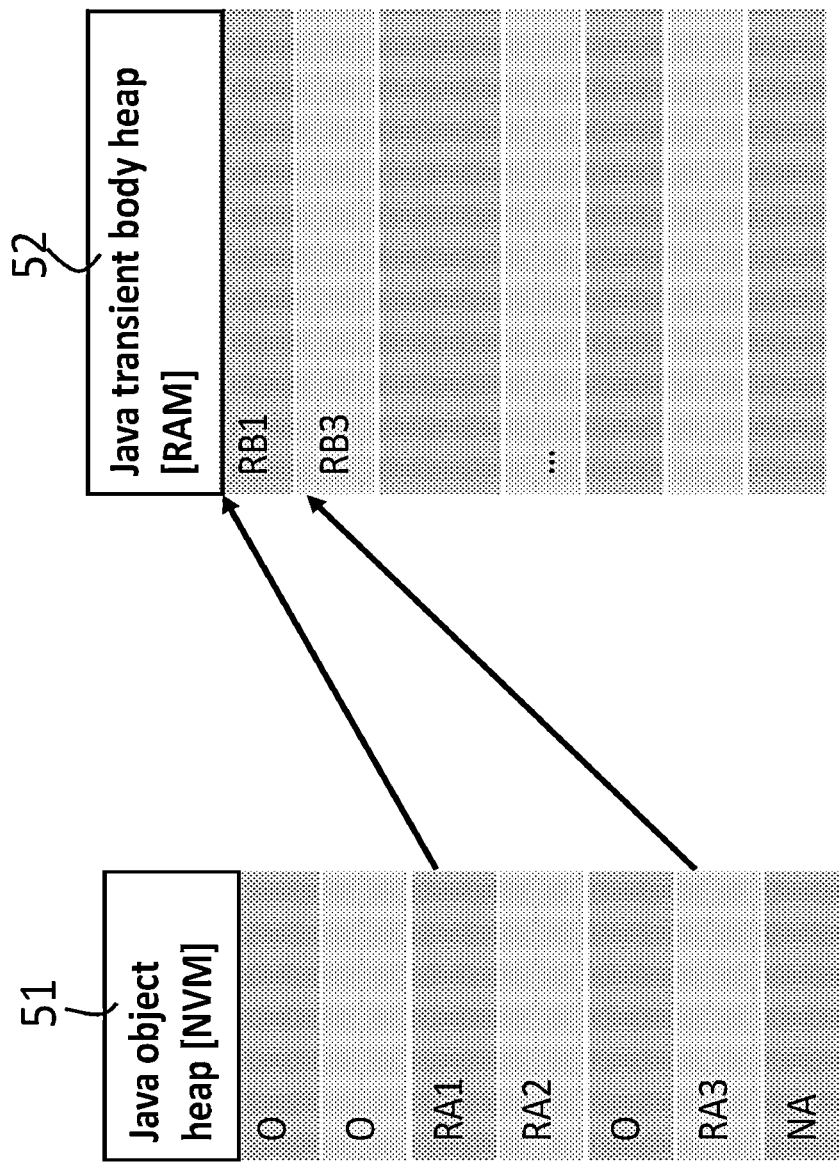

FIG. 5C depicts a third phase of the method here described in which when, then a third array body RB3 is written with a value different from zero, and is allocated in the Java transient body heap 52, allocation is performed by the third RAM array pointer RA3 as described above.

Figure 5D:
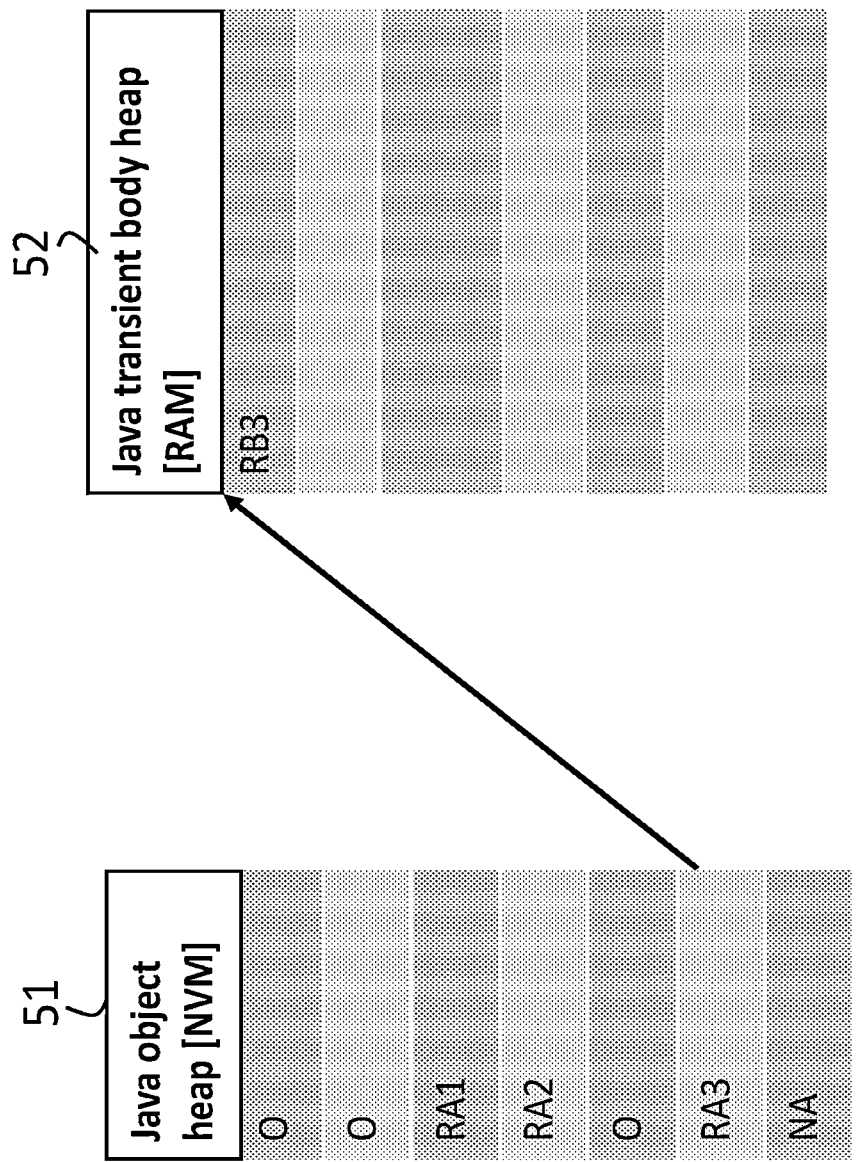

FIG. 5D shows a fourth phase in which an update of the first array RB1 occurs, this resulting in the content of the first array RB1 being set with values all equal to zero. The first array RB1 is therefore deallocated, i.e., the corresponding RAM array pointer RA1 no longer points to the physical address (for instance the pointer has a null value as address, as detailed below) of the first array RB1. As a consequence, the memory area previously allocated becomes just an area with all zero values.

Thus, in the prior art, the array pointer RA in the NVM 51 contains an indication of the array RB body size, and the body physical address, upon the application calling the method makeTransient . . . Array, the operative system assigning an area of the RAM memory, saving the address in the array pointer RA of the array RB body, the area remaining assigned to that array body RB until is deleted.

According to the embodiment described with reference to the phases of FIGS. 5A-5D, instead, the array pointer RA in the object heap 51 contains:
- an indication of the array RB body size BS (BS1, BS2, BS3 for the three pointers RA1, RA2, RA3 in the example), which is the size of the area of the transient heap 52 in the RAM memory necessary to the array RB to contain the value or values of the array body RB, and
- a body logical address LA (LA1, LA2, LA3 for the three pointers RA1, RA2, RA3 in the example), which can be the address of the memory area assigned to the to the array body RB to contain the value of the array, or the null (zero) value.

When the applet or application creates a transient array, specifically calling the method makeTransient . . . Array, the operative system does not assign an area of the transient heap 51 in the RAM memory to the array body RB. Instead, it asks the operating system to create the array pointer RA with the required body size BS, and to write a zero value in the array pointer RA as body logical address LA.

When the applet or application asks the operating system to write a value different from zero in any point of the array body RB, the operative system assigns an area of the RAM memory, with the size indicated in the array pointer RA body size B, to the array body RB and saves its address in the body logical address LA of the array pointer RA of the array body RB. That area of the memory remains assigned to that array body RB until is deleted (freeing the memory which was reserved to it both in the object heap 51 and transient heap 52). When the applet or application requests the operating system to fill with zeroes the array body RB, the operating system writes in the body logical address LA of the array pointer RA of the array RB a zero value and frees the RAM memory associated to the array body RB, making it available to other arrays that may need it.

The method here described may comprise, as shown in FIG. 7, which shows an embodiment 200 of the method, a procedure 210 of creating transient arrays, e.g., RB1, RB2, RB3. Such procedure may be activated upon requests for instance of an applet or application calling a Java Card method making transient arrays MTA, for instance MakeTransient . . . Array.

As mentioned, such creating 210, which is in general performed by a software module in the non-volatile memory 52, not shown, generates or creates 212 the array pointers RA1, RA2, RA3 in the heap 52, such pointers comprising logical addresses LA1, LA2, LA3, defining a body of the length requested, BS1, BS2, BS3, by the application, however no actual array RB1, RB2, RB3 is actually stored, i.e., actually allocated in the RAM 52 at the time of the execution of this step 212.

It is here specified that creating 210 a transient array RB may be embodied by using a make transient array method—generically indicated as MakeTransient . . . Array (see also https://docs.oracle.com/javacard/3.0.5/api/javacard/framework/JCSystem.html), . . . standing for the type of array, in the example here described reference to MakeTransientBytesArray is made—and creating the corresponding array pointer, or header, RA, as mentioned with logical LA rather than physical PA addresses.

As mentioned, here in the example a MakeTransientBytesArray is used, although makeTransientArray for each type of array can be used, e.g., Boolean, byte, short, Object. Here in the following with makeTransientXXXArray is indicated in a method allocating transient array as specified by Java Card API specification with a generic type XXX, i.e., XXX can be Boolean, byte, short, Object. Thus, in general, the method described comprises creating transient arrays by a Java Card method creating transient array, in particular one or more of:
makeTransientBoolenArray
makeTransientByteArray
makeTransientShortArray
makeTransientObjectArray.

In particular such creating 212 one or more array pointers RA comprises creating the one or more array pointers RA with a required body size BS and writing a null value as body logical address LA.

Then, upon writing at least a value different from zero, indicated with NZV, to a given transient array RB, performing an operation 218 of assigning then in the RAM memory 52 area memory only to transient arrays, RB1, RB3 in FIG. 5C, corresponding to the respective one or more array pointers RA, which comprise at least a value different from zero. A physical area in the RAM transient heap 52 is reserved to the corresponding transient array 52 by having the corresponding pointer RA pointing to the corresponding physical address or set of physical addressed in the RAM, for instance through a Memory Management Unit (MMU) mapping the logical address LA in a physical address PA.

In particular such assigning 218 then in the RAM memory 52 area memory only to transient arrays RB1, RB2, RB3, corresponding to the respective one or more array pointers RA, which comprise at least a value different from zero comprises, when writing a value different from zero in any point of an array body RB, assigning an area of the RAM memory 52, with the size indicated in the body size BS, to the corresponding transient array (RB) and saving its address in the logical address LA of the corresponding array pointer RA. This is then mapped to a physical address by the MMU.

Then, an operation of deallocating 220 in the RAM memory 52 transient arrays RB1 which values are all equal to zero may be performed, by modifying the corresponding pointer to point no longer to a physical address in the RAM 52.

In particular, comprising the operation of deallocating 220 comprises storing in the logical address LA either an address of the memory area assigned to the to the array body RB or a null value.

The deallocating comprising, when the transient array RB in the RAM memory 52 is filled with zeroes, i.e., contains all zero values AZV, writing in the indirect or logical address LA of the corresponding array pointer RA a zero value.

Of course, embodiment 200 is just exemplary, allocations 210 and deallocations 220 may occur in any sequence and number, provided that there is an array allocated to deallocate.

Thus, the method here described basically, with reference also to the flow diagram of FIG. 7 schematically illustrating an embodiment 200 of the method, it is a method of managing memory, such as memory 1084, in an integrated circuit card 108 using a Java Card platform, the integrated circuit card 108 comprising a non-volatile memory portion 51 and a RAM memory portion 52, the method comprising a procedure 210 for the allocation of one or more transient arrays in the RAM memory portion 52, the procedure comprising:

creating 212 in a non-volatile memory heap 51 one or more array pointers RA1, RA2, RA3, corresponding to one or more transient arrays RB1, RB2, RB3 to be allocated, each array pointer RA1, RA2, RA3 comprising a transient array size BS and a transient array address, in this case logical address LA (in another embodiment an indirect address IA, as described below), wherein the creating operation 212 comprises creating one or more array pointers RA comprising as transient array address an address, e.g., pointing indirectly to an area of the RAM memory portion in which the respective transient array RB1, RB2, RB3 is to be allocated, and assigning 218 then in the RAM memory 52 area memory only to transient arrays RB1, RB2, RB3, corresponding to the respective one or more array pointers RA, which comprise at least a value different from zero.

Then the method may comprise, in particular subsequently, deallocating (see also operation 220) in the RAM memory, i.e., Java transient body heap 52, transient arrays, such as RB1 which values are all equal to zero, i.e., clearing the value to zero, as described for instance with reference to FIG. 5D. Such clearing may be performed by the application managing the transient array, e.g., RB1.

Since the RAM is more dynamic, having the header in non-volatile memory, such as Java object heap 51 (also of the RAM offset) is inefficient. To this regard, in FIG. 6 it is shown schematically an embodiment in which an indirection table 53 is introduced, stored in the RAM memory.

Specifically, a COR (Clear On Reset) array block allocation table 53 is provided, which comprises body references RE, in the example a first body reference RE1, a second body reference RE2 and a third body reference RE3. The first RAM array pointer RA1 in this embodiment points to the body reference RE1, which is a header which in its turn point to the first array body RB1. The second array pointer RA1 and third array pointer RA2 in the same way point respectively to the second body RB2 and third body RB3 through second body reference RE2 and a third body reference RE3.

The method comprises thus providing an indirection table, i.e., COR (Clear On Reset) array block allocation table 53, stored in the RAM memory, comprising body references RE1, RE2, RE3 pointing to respective arrays RB1, RB2, RB3 and to which the RAM array pointers RA1, RA2, RA3 ordinately point, i.e., the array pointer RA points to the body reference RE which points at its respective array RB. The body reference RE embodies the pointer to the physical address in the RAM 52 of the corresponding array RB.

Thus, in variant embodiments, with the indirection table 53, the array pointer RA in the Java object heap 51 comprises:

an indication of the array body RB size BS, which is the size of the area of RAM memory in the Java transient body heap 52 necessary to the array body RB to contain the values of the array body RB, and a body indirect address IA, which is an address of the memory area which contains the indirection table 53 in the RAM memory, pointing to a corresponding reference address RE from which the physical address of the RAM memory, assigned to the array body RB to contain the value of the array or the zero value, can be retrieved (e.g., the physical address of the RAM memory is computed by adding a constant to the reference address RE or any other way).

In the array pointer RA is not saved the variable address of the body RB, but rather the fixed address of a memory portion of the RAM assigned to the array RB and designed to contain the address of the body array RB.

It is here specified that the transient array is defined in general as a logical address, also regarding the indirect address IA, since a logical address it is considered a virtual address which is mapped to a physical address through a third element. In the case of the logical address LA such element may be a Memory-Management Unit. In the case of the indirect address IA such element may correspond to the indirection table 53.

Figure 6:
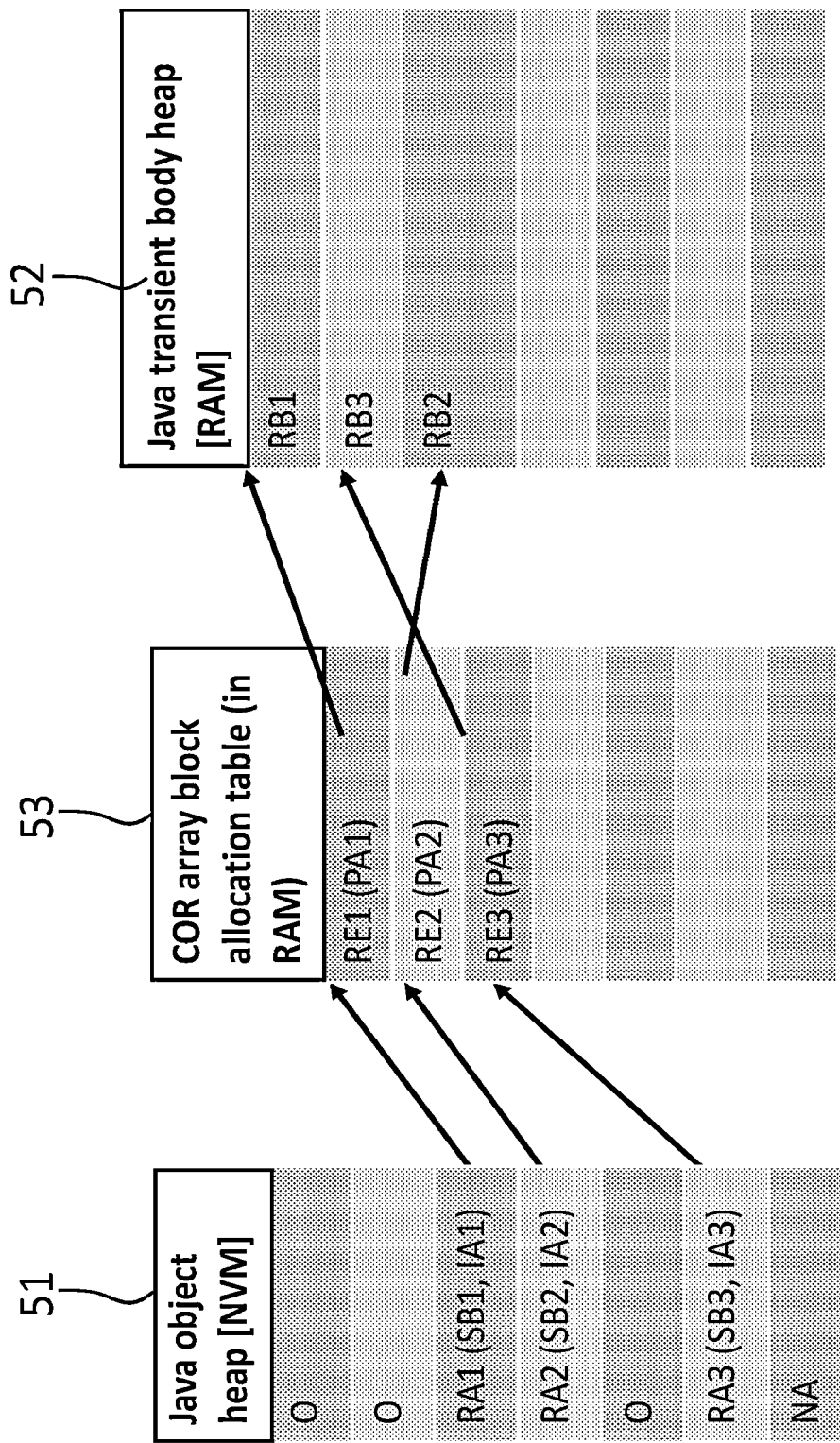
FIG. 6 is a schematic illustrative of a variant of the method according to embodiments.

In FIG. 8 it is shown a flow diagram corresponding to the variant embodiment of FIG. 6.

With respect to the flow diagram of FIG. 7, between operations 212 and 218 is introduced an operation 215 of providing an indirection table 53, stored in the RAM memory 52, comprising reference addresses RE1, RE2, RE3 pointing to physical locations, PA1, PA2, PA3, of respective arrays RB1, RB2, RB3 in the RAM memory (52) and to which the RAM array pointers RA1, RA2, RA3 in the non-volatile memory, comprising a logic pointer ordinately point.

In particular, the array pointers of operation 212 comprises as transient array address an indirect address IA, instead of logical address LA, which comprises a null value or an address of the memory area containing the indirection table 53 in the RAM memory, comprising a corresponding reference address RE which in its turn contains the physical address of the RAM memory assigned to the array RB.

The array creation, i.e., creation of an array pointer RA, as mentioned, does not imply allocation, i.e., actual reservation of memory area for the array in RAM and so it is not limited by the available RAM.

Out of memory occurs when one of the created array RA is to be used, and so to be allocated in RAM, and the available memory in that moment is not enough.

Thus, to avoid the out of memory event at array use, the array creation shall be limited, by a heuristic, i.e., a set of rules.

An "extra memory" is thus provided by a check rule represented by way of example, by the following equation:

If (tot_body_created>
    (physical_available_memory*c)) then out_
    of_memory                                      (1)

where:
tot_body_created indicates a memory value which is the sum of the size of all the created arrays (even if not allocated in the RAM at that moment), which correspond to all the executed makeTransientXXXArray in the device;
physical_available_memory indicates a memory value which is the size of the physical memory in the RAM memory;
c indicates a safety factor that if equal to one corresponds to the safest condition, which is also the most inefficient, equivalent to having all the memory is statically allocated, if greater than one corresponds to having some virtual extra memory available. As exemplified below, the safety factor c can be multiplied by the physical_available_memory or also added. Thus, more generally the physical_available_memory is increased by a safety amount which is function of the safety factor c;
out_of_memory indicates the signaling of an out of memory event.

Thus the method in embodiments may comprise applying a checking rule (Equation (1)), checking if a memory value, e.g., tot_body_created, representing the sum of the size of all the created arrays, e.g., RB1, RB2, RB3, is greater than a memory value representing the size of the total physical memory, e.g., physical_available_memory, in the RAM memory, increased by a safety amount which is function of the of a settable parameter value, e.g., safety factor c, in particular multiplied or summed by such settable parameter value, and in the affirmative signaling an out of memory event, e.g., out_of_memory.

Having an out of memory event at applet execution may cause problems. So, it is to be considered also the option that the check by applying the rule, i.e., equation (1), on the memory used by an application is performed at "applet selection" and, if an out of memory event occurs, it requests the failure of the selection.

Thus, the method in embodiments may comprise performing the checking at an applet selection and, if an out of memory event, e.g., out_of_memory occurs, requesting the failure of the selection.

By way of example, Java Card supports OneShot objects, which are system objects that can be used by any Applet to perform cryptographic operation. The applet must use one object at a time, and it must get, use, and then release the object.

The value of tot_body_created by the OneShot objects may be for example in the platform here exemplified, 2128 bytes [this is true on our platform, it can be different on other platforms/OS], but the memory allocated in the RAM may be a maximum of 542 bytes, when the OneShot object with the biggest total size of arrays is used.

This means that 1586 bytes (=2128−542) of memory are never used simultaneously with the remaining 542 bytes.

In this case, applying the check rule:

if (tot_body_created=2128>(physical_available_
    memory+1586)) then out_of_memory. The
    value 1586 represents the extra memory.

Here, the physical available memory is increased by a safety amount which is function of the safety factor c in that a value of memory equal to safety factor c is summed to it. This corresponds of course to multiplying the physical_available_memory by a factor c'=(20,000+1586)/20,000), i.e., (physical_available_memory+c)/physical_available_memory.

By way of example, are here below represented a header structure (struct) according to the prior art and according to the method using the indirection table 53. As mentioned, in both cases, the header or pointer RA is allocated in the object heap 51 when it is requested to create the corresponding array body RB. As also shown, the solution here described provides that the array pointers RA so created are then not modified until the object is deleted.

Thus, a prior art header struct may be as follows:

```
typedef struct
{
    u1T flags;              // indicating if the mode is transient on select, on deselect, etc.
    u1T ownedPackageIdx;    // Package to which the applet which has created the object belongs
    u1T ownedAppletIdx;     // applet which has created the object
    u2T elementCount;       // size of the array
    u2T ramOffset;          // index in the RAM memory.
```

Therefore, the header struct comprises a 'flags' variable indicating the mode (on select, deselect), an ownedPackageIdx variable indicating the Package to which the applet which has created the object belongs and an ownedAppletIdx variable indicating the applet which has created the object. Then the variable elementCount corresponds substantially to the field BS indicated above, i.e., stores the size of the array, and the ramOffset variable corresponds substantially to the physical address PA, represented by way of an offset address, i.e., storing an offset with respect to the beginning of the RAM (e.g., if the RAM is 32 kb in size goes from 0x20000 to 0x28000, an offset "0x500" then indicates that the physical space allocate to a certain transient array RB is at 0x20500; if the array is 0x80 bytes in size, occupies the physical space 0x20500→0x2057F).

Thus, the physical address of an array is 0x20000+ headerPtr→ramoffset.

Using the indirection table 53 instead in the header struct, with respect to the prior header structs an index in the indirection table 53, e.g., bodycabatIdx, may be added in place of the offset.

Therefore, the struct corresponds substantially to the one of the prior art besides for a bodyCabatIdx variable, which embodies the indirect address IA. In particular the bodyCabatIdx index points to the array of the indirection table 53 which has a base address in the RAM 52 (e.g., begins at address 0x20000), the index itself indicates and offset inside the indirection table 53. Each entry in the indirection table 53 is for instance of two bytes and comprises an offset in the physical memory (the one indicated as ramOffset). The array which contains such elements (indirection table 53) is in the RAM.

Thus, the physical address of an array is: 0x20000+cabat_array[headerPtr→bodyCabatIdx], i.e., the starting address plus the address written in the table 53 (reference RE) to which index, bodyCabatIdx, the pointer RA, headerPtr, points.

Such an indirection, as mentioned, is very useful as allocating/deallocating arrays from the RAM is performed in a more dynamical manner, thus optimization of such operations is very important. In the prior art, deallocation requires a writing operation in the flash. In the solution with the indirection table 53, writing operations are only in RAM since the indirection table 53 remains always the same, while the modified value is cabat_array[headerPtr→bodyCabatIdx] which resides in RAM, in a specific area memory storing the table 53.

Thus, the advantages of the solution described hereabove are clear.

The method for managing memory in an integrated circuit card using Java Card described is faster than the known methods without compromising reliability, and also interoperable, as no modifications to the application code take place.

The method described allows allocating volatile memory to the array only for as long as it is actually used, not from when it is created to when it is no longer reachable as per prior art solutions.

The method described allows to increase the amount of available memory since it keeps in memory only non-empty arrays.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A method of managing memory in an integrated circuit card having a non-volatile memory portion and a random access memory (RAM) memory portion, the method comprising:
    creating, in a non-volatile memory heap in the non-volatile memory portion, one or more array pointers corresponding to respective one or more transient arrays to be allocated in the RAM memory portion, each array pointer comprising a transient array size and a transient array address, each transient array address being a logical or indirect address pointing indirectly to an area of the RAM memory portion in which a respective transient array is to be allocated; and
    assigning, in the RAM memory portion, memory only to non-zero transient arrays having at least one value different from zero.

2. The method according to claim 1, wherein:
    the creating the one or more array pointers comprises creating the one or more array pointers with a required body size and writing a null value in each transient array address as a body logical address; and
    the assigning comprises, based on writing a value different from zero in any point of an array body, assigning a memory area of the RAM memory portion, with the required body size, to the corresponding transient array, and saving the corresponding transient array address in the body logical address of the corresponding array pointer.

3. The method according to claim 1, further comprising providing an indirection table, stored in the RAM memory portion, comprising reference addresses pointing to physical locations of respective arrays in the RAM memory portion, and to which the RAM array pointers in the non-volatile memory portion ordinately point.

4. The method according to claim 3, wherein each RAM array pointer comprises as the respective transient array address an indirect address that comprises a null value or an address of the memory area containing the indirection table in the RAM memory portion, comprising a corresponding reference address that contains a physical address of the RAM memory portion assigned to the respective transient array.

5. The method according to claim 1, further comprising deallocating, in the RAM memory portion, each transient array having values all equal to zero.

6. The method according to claim 2, further comprising storing in the logical or indirect address either an address of the memory area assigned to the array body or the null value.

7. The method according to claim 5, wherein the deallocating comprises, based on each transient array in the RAM memory portion being filled with zeroes, writing in the logical or indirect address of the corresponding array pointer a zero value.

8. The method according to claim 1, further comprising performing a Java Card method for making the transient arrays.

9. The method according to claim 1, further comprising:
    applying a checking rule checking whether a memory value representing a sum of a size of all the created transient arrays is greater than a memory value representing a total physical memory in the RAM memory portion increased by a safety amount that is a function of a settable parameter value; and
    signaling an out of memory event in response to the checking rule being affirmative.

10. The method according to claim 9, wherein the function is multiplying or summing by the settable parameter value.

11. The method according to claim 9, further comprising:
    performing the checking in response to an application selection; and
    in response to the out of memory event, requesting a failure of the application selection.

12. An integrated circuit card, comprising:
    a non-volatile memory portion;
    a random access memory (RAM) memory portion; and
    a processor communicatively coupled to the non-volatile memory portion and the RAM memory portion, and configured to:
        create, in a non-volatile memory heap in the non-volatile memory portion, one or more array pointers corresponding to respective one or more transient arrays to be allocated in the RAM memory portion, each array pointer comprising a transient array size and a transient array address, each transient array address being a logical or indirect address pointing indirectly to an area of the RAM memory portion in which a respective transient array is to be allocated; and assign, in the RAM memory portion, memory only to non-zero transient arrays having at least one value different from zero.

13. The integrated circuit card according to claim 12, wherein the integrated circuit card is an embedded Universal Integrated Circuit Card (eUICC) using a Java Card platform.

14. The integrated circuit card according to claim 12, wherein:

the processor configured to create the one or more array pointers comprises the processor configured to create the one or more array pointers with a required body size and writing a null value in each transient array address as a body logical address; and the processor configured to assign comprises the processor configured to, based on writing a value different from zero in any point of an array body, assign a memory area of the RAM memory portion, with the required body size, to the corresponding transient array, and save the corresponding transient array address in the body logical address of the corresponding array pointer.

15. The integrated circuit card according to claim 12, further comprising the processor configured to provide an indirection table, stored in the RAM memory portion, comprising reference addresses pointing to physical locations of respective arrays in the RAM memory portion, and to which the RAM array pointers in the non-volatile memory portion ordinately point.

16. The integrated circuit card according to claim 15, wherein each RAM array pointer comprises as the respective transient array address an indirect address that comprises a null value or an address of the memory area containing the indirection table in the RAM memory portion, comprising a corresponding reference address that contains a physical address of the RAM memory portion assigned to the respective transient array.

17. The integrated circuit card according to claim 12, further comprising the processor configured to deallocate, in the RAM memory portion, each transient array having values all equal to zero.

18. The integrated circuit card according to claim 14, further comprising the processor configured to store in the logical or indirect address either an address of the memory area assigned to the array body or the null value.

19. The integrated circuit card according to claim 12, further comprising the processor configured to perform a Java Card method for making the transient arrays.

20. The integrated circuit card according to claim 12, further comprising the processor configured to:

apply a checking rule checking whether a memory value representing a sum of a size of all the created transient arrays is greater than a memory value representing a total physical memory in the RAM memory portion increased by a safety amount that is a function of a settable parameter value; and signal an out of memory event in response to the checking rule being affirmative.

* * * * *